United States Patent [19]

Goronkin et al.

[11] 3,921,192

[45] Nov. 18, 1975

[54] AVALANCHE DIODE

[75] Inventors: Herbert Goronkin, Dewitt; Wirojana Tantraporn; Se Puan Yu, both of Schenectady, all of N.Y.

[73] Assignee: General Electric Company, Schenectady, N.Y.

[22] Filed: May 28, 1974

[21] Appl. No.: 473,565

[52] U.S. Cl. .................... 357/13; 357/12; 331/107

[51] Int. Cl.² ....................H01L 29/88; H01L 29/90; H03F 1/36

[58] Field of Search ............ 357/12, 13, 88, 89, 90; 331/107

[56] References Cited

UNITED STATES PATENTS

| | | | |
|---|---|---|---|
| 3,566,206 | 2/1971 | Bartelink et al. | 357/13 |
| 3,600,649 | 8/1971 | Liu et al. | 357/13 |
| 3,646,411 | 2/1972 | Iwasa | 357/13 |
| 3,739,243 | 6/1973 | Semichon | 357/13 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

An avalanche diode including an active region having a barrier side and a collector side in which the net activator concentration in a first zone of the active region adjacent the barrier side is substantially lower than the net activator concentration in a second zone contiguous to the first zone and to the collector side of the active region, the second zone being of greater longitudinal extent than the first zone.

8 Claims, 6 Drawing Figures

AVALANCHE DIODE

The present invention relates in general to avalanche diodes and in particular to such diodes for operation in the TRAPATT mode.

Avalanche diodes in a variety of forms are utilized in circuits to provide high frequency oscillations. In one form the avalanche diode comprises a body of semiconductor material including an end region of one conductivity type and relatively high conductivity, an intermediate or active region of opposite conductivity type and of relatively moderate conductivity, and another end region of opposite conductivity type and relatively high conductivity. Conveniently, such diodes are designated in the art as P+NN+ or N+PP+ diodes. In one mode of operation of such diodes as oscillators, referred to as the IMPATT (Impact Avalanche Transit Time) mode, a resonant circuit is connected across the ends of the diode and the diode is reversely biased from a d-c source at a point on the static current versus voltage characteristic where substantial avalanche multiplication of conduction carriers occurs (i.e. avalanche multiplication of the order of one million) in the intermediate region adjacent the PN junction referred to as the avalanche zone. In steady state operation the conduction carriers of appropriate sign produced by the avalanche process move under the influence of the electric field in another zone of the intermediate region referred to as the drift zone at close to saturation drift velocity and are collected at the end region remote from the PN junction. The frequency of the resonant circuit and the distance traversed by the conduction carriers in the intermediate region are correlated so that the time of transit of the avalanche carriers under the influence of electric field at saturation drift velocity substantially equals one-half the period of the high frequency wave. The current flow in the external resonant circuit due to the motion of conduction carriers in the intermediate region is substantially 180° out of phase with the high frequency voltage across the resonant circuit. Accordingly, energy from the power supply is converted into high frequency energy in the resonant circuit. In this mode of operation frequencies of tens of gigaHertz may be obtained with suitably constituted and proportioned avalanche diodes, and suitably tuned circuits.

In another conventional mode of operation of the avalanche diode, referred to as tthe TRAPATT (Trapped Plasma Avalanche Transit Time) mode, the voltage applied to the diode by circuits such as those described in "Circuits for High-Efficiency Avalanche Diode Oscillators" by W. J. Evans, IEEE Transactions on Microwave Theory and Techniques, Vol. MTT–17, No. 12, Dec. 1969, pgs. 1060–1067, contains a high and narrow peak, the height and width of the peak being dependent on circuit conditions. During the time that the high and narrow peak of voltage appears at the diode, the electron-hole pair generation rate is so high that the conductivity of the plasma produced thereby causes a reduction of the electric field intensity in the vicinity of the PN junction. The rate of change of the spatial gradient of the electric field $$\frac{\delta}{\delta t} \quad \frac{(\delta E)}{\delta X}$$

caused by plasma generation may be larger than the quantity $v_s \cdot \delta p/\delta x$, where $p$ is the background doping density or net activator concentration and $v_s$ is the saturation velocity of majority carriers. Under these conditions an electric field maximum which grows and travels away from the PN junction to the collector terminal of the diode at a velocity greater than majority carrier saturation velocity. The traveling electric field maximum is referred to as the electric field shockfront. For a given level of current density the shockfront velocity is inversely proportional to the background doping density $p$.

The rising part or leading edge of the voltage peak occurs during depletion of the diode in the preceding cycle of TRAPATT mode operation. The falling part or trailing edge of the voltage peak occurs as a result of interaction of diode and circuit. As current rapidly increases in the diode due to electric field shockfront movement and plasma formation the circuit reacts and the voltage across the diode drops to a very low value. Charge carriers of both kinds in the plasma are drained after a period of time into the electrodes of the diode. The circuit must be suitably constituted to allow such drainage after which another peak of voltage is allowed to initiate another cycle of TRAPATT operation.

Thus, in the TRAPATT mode, the cycle of operation may be divided into three periods. An initial period during which the diode is depleted of conduction carriers, a second period during which an electron-hole plasma is formed, and a third period during which the electron-hole plasma is drained or removed from the active region. The period of a cycle of operation is largely determined by the time required for drainage of the plasma from the diode.

In practice, the active region of the avalanche diode for operation in the TRAPATT mode is doped to a background density $p_0$ substantially constant throughout the active length L. Such a diode can undergo IMPATT oscillation as described above with a period corresponding to a few times L divided by the saturation velocity $v_s$ of conduction carriers. It is believed that the IMPATT oscillation excites the circuit at the circuit resonance frequencies. The high frequency or r-f voltage so produced eventually becomes sufficient in amplitude to provide a peak of voltage to initiate TRAPATT action with the electric field shockfront described above. Thereafter TRAPATT action is sustained provided the circuit can appropriately interact at the TRAPATT frequency. Generally the TRAPATT frequency is a factor of 3 or 4 lower than the IMPATT frequency corresponding to the length L of the active region of the diode.

Since for a given length L the voltage required to bring about avalanche breakdown is higher for smaller background doping level $p$, higher power and efficiency should be obtained for smaller values of $p$. However, in practice it has been found that TRAPATT operation cannot be sustained even under short pulse conditions if the doping level or net activator concentration is too low. For a diode having a pL product of less than 3–4 $\times 10^{11}$ cm$^{-2}$ it has heretofore been impossible to sustain TRAPATT oscillations. The $p$L product (or $n$L product if the conductivity type of the active region is N-type) is the integral of the net activator concentration $p$ in the active region of the diode over the length L of the active region.

As mentioned above, the shockfront velocity $v_f$ and hence the growth rate of the electric field maximum are both inversely proportional to the background doping density $p$. For a certain length L there exists therefore a lower limiting value for $p$ for which the electric field growth rate cannot be arrested by the rate of the voltage drop across the diode through the circuit interaction, and in such a diode the semiconductor material would be destroyed. It is speculated that the extremely high electric field so obtained could move the lattice ions themselves. For a a circuit with faster response a lower value of $p$ could be tolerated. For a practical circuit this value of $p$ is approximately $1.3 \times 10^{15}$ $cm^{-3}$ if the length of the active region of the diode is 3 microns as stated above.

From the foregoing analysis the features desired in TRAPATT diodes are the following:

1. Ease of shockfront initiation.

This requires that the background doping gradient be very small, $$\frac{\delta p}{\delta X} \approx O,$$

in the high field region adjacent the rectifying contact.

2. High efficiency of d-c to high frequency energy conversion.

As efficiency increases with reverse bias voltage, the average doping or net activator concentration level $$\frac{1}{L} \int_o^L$$

p.dx should be low to support the higher voltage.

3. High current or power density

This is provided by higher background doping level for the following reason.

Irreversible alteration or destruction of semiconductor material could occur if the growth of the electric field shockfront approaching the collector is not moderated by the voltage drop produced by interaction of diode and circuit. The rate of arrival to a point of such irreversible destruction is slower for higher doping level as such higher doping level provides a more favorable internal spacial electric field gradient. Accordingly, given the same circuit response the device-circuit interaction with a device of higher doping level can moderate the rate of growth of the shockfront, and hence allows a higher current level of TRAPATT operation without suffering the aforementioned irreversible destruction, as will be explained in more detail in connection with FIG. 3.

The present invention is directed to providing avalanche diodes having the above mentioned features singly and in combination.

A general object of the present invention is to provide improvements in avalanche diodes for operation in the TRAPATT mode.

A specific object of the present invention is to provide avalanche diodes of lower average values of $n$L or $p$L products for operation in the TRAPATT mode.

In accordance with one aspect of the present invention, ease of shockfront initiation and high power level of operation are obtained by the provision of a low net activator concentration or doping level near the rectifying contact of the diode and a substantially higher net activator concentration adjacent the non-rectifying contact. The doping profile in the active region from the non-rectifying contact to the rectifying contact is contoured to provide as low an overall average net activator concentration consistent with the aforementioned objectives to obtain high efficiency as well. The low net activator concentration portion of the active region could be a value corresponding to intrinsic conductivity of the semiconductor material i.e., this portion could be made as pure a material as technology is capable of producing while the high net activator concentration portion could be of the order of $1 \times 10^{15}$ $cm^{-3}$ for a diode having an active region of 3 microns length between the rectifying and non-rectifying contacts thereof. In the context of the above desired objectives the fraction of the length of the low doped portion to the total length of the active region would lie approximately in the range of ¼ to ½.

The features of the invention which are believed to be novel are set forth with particularity in the appended claims. The invention itself, together with further objects and advantages thereof, may be best understood with reference to the following detailed description taken in connection with the accompanying drawing in which:

Figure 1:
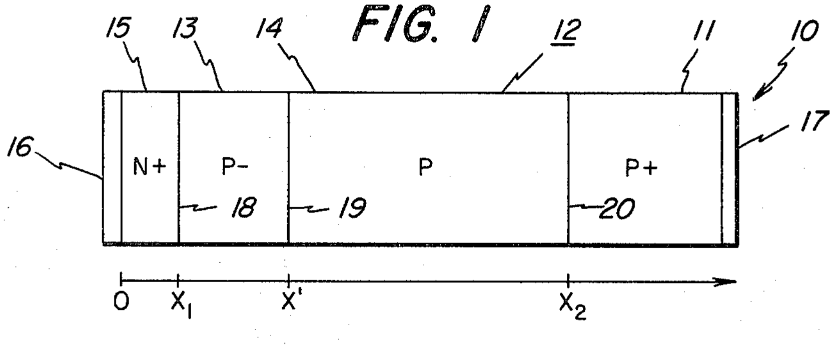
FIG. 1 is a sectional diagram of an avalanche diode in accordance with the present invention.
Figure 3:
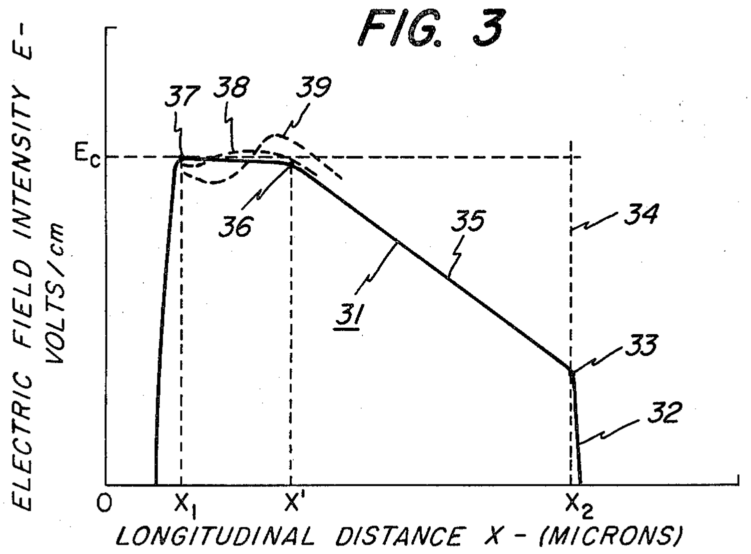

FIG. 3 shows a graph of electric field intensity in the semiconductor device of FIG. 1 as a function of distance along the longitudinal axis of the device with a reverse bias voltage applied to deplete the intermediate or active region of the device of majority conduction carriers. In this figure are also shown in dotted outlines graphs useful in explaining the operation of the diode in accordance with the invention.

Figure 4:
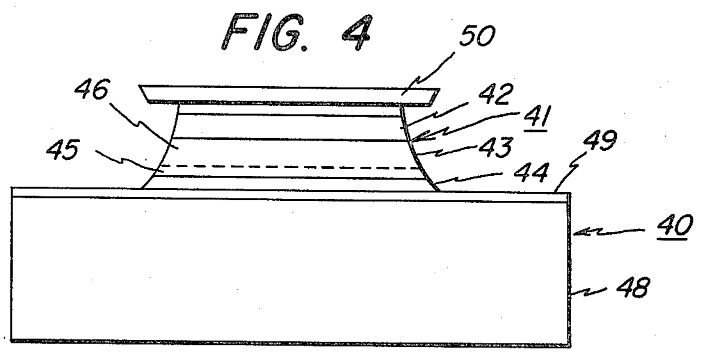

FIG. 4 is a sectional view of another embodiment of a diode in accordance with the present invention showing internal construction thereof.

Figure 5:
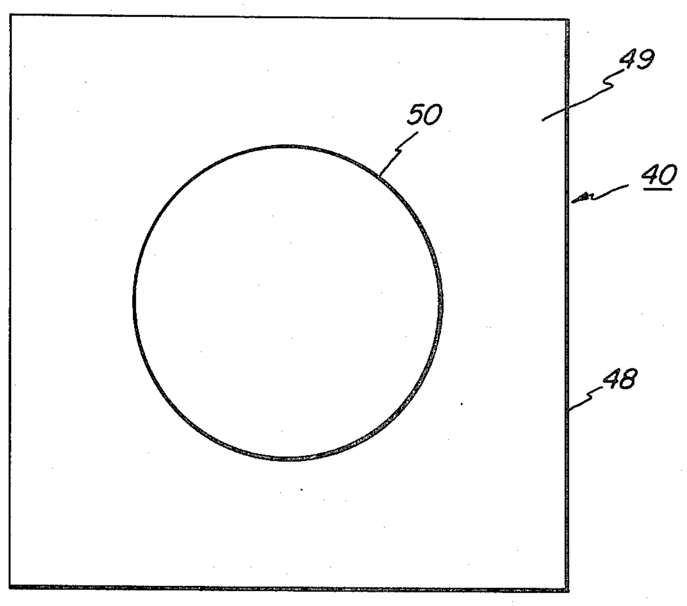

FIG. 5 is a plan view of the diode of FIG. 4.

Figure 6:
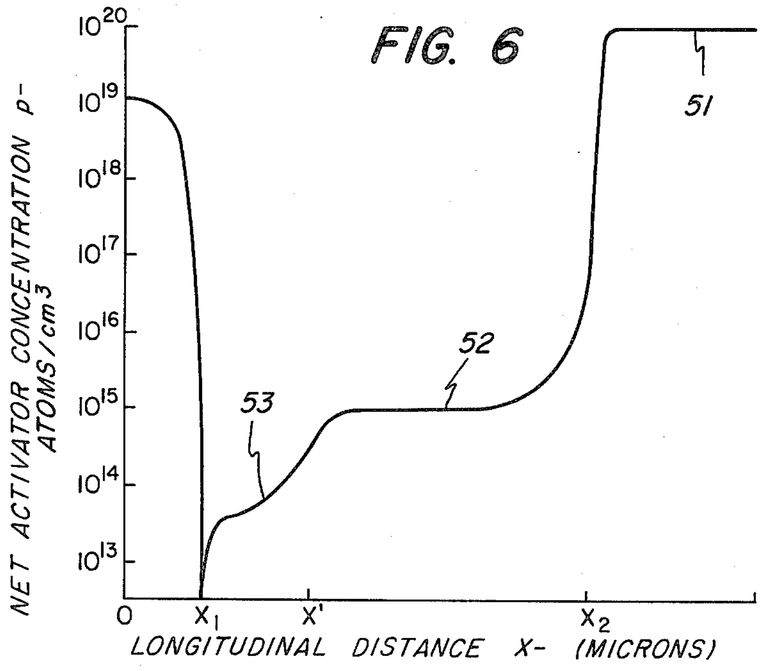

FIG. 6 shows a graph of the net activator concentration profile of the semiconductor device of FIGS. 4 and 5 as a function of distance through the semiconductor wafer thereof from the top surface thereof to the bottom surface thereof.

Reference is now made to FIG. 1 which shows a diode 10 including a body of silicon semiconductor material having a third region 11 of one conductivity type conveniently shown as P-type and high conductivity or low resistivity, a first region 12 of P-type conductivity having a first zone 13 of low conductivity or high resistivity and a second zone 14 of moderate conductivity or moderate resistivity and also including a second region 15 of N-type conductivity and of high conductivity or low resistivity. The device 10 may be formed by initially starting with a substrate of silicon material of high conductivity which constitutes the third region and epitaxially growing the first or active region thereon. The net activator concentration introduced into the first region is controlled so as to produce the two zones, that is, the first and second zones having respectively low and moderate conductivity. Thereafter the second region is formed in a portion of the epitaxially grown region by diffusion of donor activators or impurities therein. Suitable metal electrodes 16 and 17 are secured to the second region 15 and third region 11, respectively, for facilitating connection of the device in an electrical circuit. A scale for the longitudinal dimension of the device is shown in FIG. 1. The distance $x_1$ from the origin located at the external surface of the second region represents the location of the PN junction 18 of the device. The distance $x'$ represents the distance from the origin to the interface 19 between the first and second zones of the first region 12 and the distance $x_2$ represents distance from the origin to the interface 20 between the second zone 14 and the third region 11.

Figure 2:
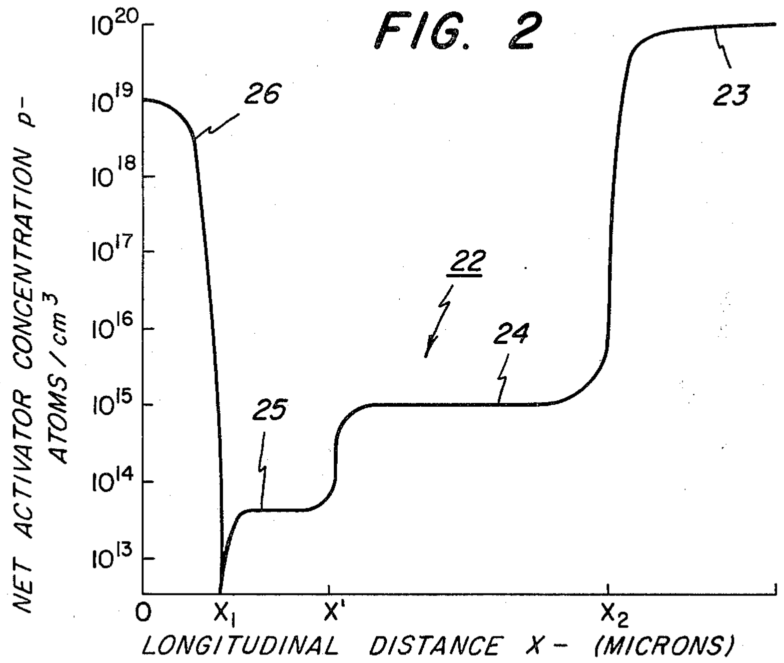
FIG. 2 is a graph of the net activator concentration profile of the semiconductor device of FIG. 1 in which the net activator concentration is set forth on a logarithmic scale along the ordinate of the graph and the distance along the longitudinal axis of the device is set forth along the abscissa of the graph.

Reference is now made to FIG. 2 which shows a graph 22 of the net activator concentration in the silicon semiconductor material of the device as a function of longitudinal distance $x$. The net activator concentration in the third region 11, represented by graph segment 23, is of the order of $10^{20}$ atoms/cubic centimeter and corresponds to a low value of resistivity, for example 0.005 ohm-cm. The net activator concentration in the second zone 12 of the first region, represented by graph segment 24, is of the order of $10^{15}$ atoms/cubic centimeter corresponding to substantially lower conductivity, conveniently designated moderate conductivity. Over the first zone 13 of the second region the net activator concentration, represented by graph segment 25, is of the order of $5 \times 10^{13}$ atoms/cubic centimeter which is substantially lower than the net activator concentration in the second zone 14 and is conveniently designated a zone of low conductivity. The net activator concentration in the second region 15, represented by graph segment 26, is of the order of $10^{19}$ atoms/cubic centimeter and is a region of low resistivity, for example 0.01 ohm-cm. A device such as shown in FIG. 1 and having a profile 22 such as shown in FIG. 2 in which the longitudinal extent of the first zone is about 1 micron and the longitudinal extent of the second zone is about 2 microns would be suitable for operation in a conventional circuit for providing TRAPATT oscillations of the order of 3 gigaHertz. Conventional circuits for the operation of avalanche diode in the TRAPATT mode are described in the aforementioned article "Circuits for High-Efficiency Avalanche Diode Oscillators" by W. J. Evans.

Reference is now made to FIG. 3 which illustrates the operation of the device of FIG. 1. This figure shows a graph 31 of electric field intensity within the semiconductor device of FIG. 1 as a function of longitudinal distance when the device is reversely biased by a suitable unidirectional or d-c source of voltage such as shown in FIG. 4 of the aforementioned article connected in circuit to deplete not only the first region of the device but also a portion of the third region, i.e. the diode is reversely biased at a value well beyond the field "punch-through" value. The graph 31 includes a portion 32 in the third region rising steeply to a point 33 at the interface, represented by dotted line 34, between the third region and the first region and a portion 35 rising at a rate which is a function of the net activator concentration in the second zone until a point 36 thereon is reached having the abscissa $x'$ at which the slope begins to decrease rapidly in the first zone as the net activator concentration in this zone is substantially less than the net activator concentration in the second zone. The electric field intensity in the first zone rises gradually to a peak value 37 having the abscissa $x_1$, that is, at the PN junction 18, and thereafter the electric field intensity drops rapidly to zero in the second region of high conductivity.

In connection with the initiation of TRAPATT mode operation in the diode, FIG. 3 also shows dotted graphs 38 and 39 representing the electric field shockfront at successive instants of time elapsed from initiation of plasma charge at the zero electric field gradient point 37. In view of the relatively flat slope of the electric field in the first zone the shockfront is readily initiated and the maximum field value rapidly increases while the shockfront traverses the first zone as indicated by graphs 38 and 39. The voltage versus current response of the circuit driving the diode during this time is assumed to be appropriate to supply the charge to the diode to permit the shockfront to grow and travel to the second zone of the diode. When it reaches the heavier doped second zone of the active region the growth of the maximum field on the one hand tends to slow down as it takes more mobile charge to neutralize the background or fixed charge. On the other hand, the maximum field growth is accelerated as the shockfront approaches the collector 11, since the requirement of the spatial integral of field equaling the circuit provided voltage across the diode must be met and the space to right of the shockfront where the field is elevated becomes progressively smaller (concurrently the space to the left of the shockfront where the field is depressed becomes progressively larger). It should be noted that if the voltage across the diode is held fixed, as both the distance between the shockfront and the collector approaches zero and the field to the left of the shockfront approaches zero due to plasma conduction, the field to the right of the shockfront approaches infinity. Although the exact consequence of such "infinite" field is not known, it is reasonable to expect irreversible alteration or damage to lattice of the semiconductor as one of the consequences.

The rate of change in the electric field at the collector i.e. the internal displacement current, by the law of current continuity, is equal to the circuit current. Such current flowing through the circuit with a finite reactance produces a voltage drop and hence the diode voltage would decrease. If the response time of the circuit is sufficiently short, the diode voltage drops sufficiently fast to prevent the field maximum from growing to "infinity" as the shockfront enters the collector, so that the material would not be irreversibly altered or destroyed and stable TRAPATT operation can take place.

Since any practical circuit has a finite response time, and since the shockfront growth rate varies directly with operating current level and varies inversely with doping level, such a practical circuit including a sufficiently lightly doped diode and supplying a practical operating current level cannot be expected to "arrest" the field growth process.

However, in accordance with our invention relatively high doping level is provided near the collector (tending to reduce the growth rate of the shockfront). Accordingly, for a practical operating current range, growth rate of the field maximum as the shockfront approaches the collector is slowed sufficiently so that circuit produced voltage drop is now fast enough to moderate or arrest its growth.

Thus with the circuits commonly used for TRAPATT operation a higher power level and higher efficiency (associated with the lower doped portion near the PN junction) can be attained because of the capability to arrest (associated with the higher doped region near the collector) electric field run-away.

While the diode in accordance with the present invention operates with easy starting, high efficiency and high power density in conventional TRAPATT oscillator circuits such as disclosed in "Circuits for High-Efficiency Avalanche Diode Oscillators"by W. J. Evans mentioned above, the diode in accordance with the present invention is also suitable for operation in circuits such as described in patent application, Ser. No. 399,313, filed Sept. 21, 1973, and also in circuits such as described in patent application Ser. No. 399,314, filed Sept. 21, 1973, which do not depend on the IMPATT oscillations to initiate TRAPATT oscillations. The aforementioned article and patent applications are incorporated herein by reference.

Reference is now made to FIGS. 4 and 5 which show, respectively, a sectional view and a plan view of a practical form of the device of FIG. 1. The device 40 includes a pellet or die 41 of silicon semiconductor material including a third region 42 of P type conductivity and low resistivity, a first region 43 of P type conductivity and high resistivity, and a second region 44 of N type conductivity and low resistivity. The first region includes the first zone 45 of high resistivity adjacent the second region and a second zone 46 of high resistivity adjacent the third region. The resistivity of the first zone is higher than the resistivity of the second zone. The profile of the net activator concentration as a function of distance from the outer surface or terminal side of the second region 15 of N type conductivity is shown in FIG. 6. In this figure, the net activator concentration of the third region which conveniently may be referred to as the substrate is of the order of $10^{20}$ net activators per cubic centimeter and is represented by graph segment 51. The concentration in the second zone of the first region represented by graph segment 52, is of the order of $10^{15}$ net activators per cubic centimeter and the concentration of net activators in the first zone of the second region, represented by graph segment 52, varies from the concentration at the interface with the second zone of about $10^{15}$ net activators per cubic centimeter to a concentration in the vicinity of the PN junction between the first region and the second region of about $5 \times 10^{13}$ net activators per cubic centimeter. The distance $(x'-x_1)$ from the PN junction to the interface between the first and second zones is approximately 0.8 of a micron and the distance $(x_2-x')$ between the interface and the other face of the second zone is approximately 2.2 microns. The integral of the net activator concentration over the length of the first region per unit cross-sectional area, referred to as the pL product, is $1.8 \times 10^1$ per $cm^2$.

The pellet 41 was obtained from a wafer of semiconductor material which was formed by initially starting with a P+ substrate of high conductivity having a concentration of net activators of $10^{20}$ per cubic centimeter and epitaxially growing thereon the second zone of the first region to provide approximately $10^{15}$ net acceptor activators per cubic centimeter therein. Thereafter the first zone was epitaxially grown with a concentration of the net activators as indicated in the graph of FIG. 6 to a value of $5 \times 10^{13}$ net activators per cubic centimeter at the interface between the first region and the second region of N type conductivity. The epitaxial growth was allowed to proceed to provide additional thickness in which the N+ or second region is to be formed. The second region was formed by the diffusion of arsenic into the exposed face of the epitaxial growth to form the heavily doped N type region having a net activator concentration of about $10^{19}$ net activators per cubic centimeter. Of course, other means such as ion implantation could be used to form the second region of strongly N-type conductivity. Both sides of the wafer were coated with a thin layer of titanium and a thick layer of gold. Then an additional thick layer of gold was plated onto the initial layer of gold on the side of the wafer adjacent region 44. A pellet 41 of suitable size, that is, having a cross-sectional area of approximately $2 \times 10^{-4}$ $cm^2$, was etched. Electrode 48 represents a portion of the double plated gold layer and electrode 50 represents a portion of the single plated gold layer. The device of FIGS. 4 and 5 having an pL product of $1.8 \times 10^{11}$ per centimeter was connected in a circuit, such as described in the aforementioned article entitled "Circuits for High-Efficiency Avalanche Diode Oscillators" by W. J. Evans and was not only easily started but provided power of $2.1 \times 10^5$ watts per square centimeter at 30% efficiency at 3 gigaHertz.

While the active region of diode has been shown as P type in conductivity, it could as well be N type, and of course, the PN junction contact to the barrier side of the active region would be by means of a P+ region, and the abrupt ohmic contact to the collector side of the active region would be by another P+ region. Also, rectifying contact could be made to the barrier side of the active region by means of a suitable Schottky barrier contact.

While in the illustrative embodiments described, silicon semiconductor is utilized, other semiconductor materials such as germanium and group III–V compounds, such as gallium arsenide and indium phosphide, could be used.

While the invention has been described in specific embodiments, it is understood that modificatioins may be made by those skilled in the art, and we intend by the appended claims to cover all such modifications and changes as fall within the true spirit and scope of the invention.

What we claim as new and desire to secure by Letters Patent of the United States is:

1. An avalanche diode comprising
a body of semiconductor material including an active region of a first conductivity type having a first zone and a second zone, each having a pair of opposed faces with adjacent faces being contiguous,
said first zone having an average net activator concentration substantially lower than the average net activator concentration of said second zone,
a first longitudinal distance between opposed faces of said first zone being smaller than a second longitudinal distance between opposed faces of said second zone,
the integral net activator concentration per square centimeter of cross section over the length of said active region being less than $4 \times 10^{11}$ per $cm^2$, contact to the remote face of said first zone,
means for making non-rectifying contact to the remote face of said second zone.

2. The diode of claim 1 in which the net activator concentration over the width of said first zone being sufficiently small to provide an electric field gradient therein substantially smaller than the electric field gradient in said second zone when a depletion producing voltage is applied to said diode to completely deplete said active region of majority conduction carriers.

3. The diode of claim 1 in which the average net activator concentration of said first zone is less than one-half the average net activator concentration of said second zone.

4. The diode of claim 1 in which said first longitudinal distance is between one-half of said second longitudinal distance to a value equal to said second longitudinal distance.

5. The diode of claim 1 in which the net activator concentration decreases from a high value at the remote face of said second zone to a low value at the remote face of said first zone.

6. The diode of claim 1 in which said rectifying contact is a region of a second conductivity type opposite to said first conductivity type and of high conductivity to form a PN junction with said first region.

7. The diode of claim 1 in which said rectifying contact is a Schottky barrier contact.

8. The diode of claim 1 in which said non-rectifying contact is a third region of said first type conductivity and of high conductivity contiguous to the remote face of said second zone.

* * * * *